United States Patent
Pasadyn et al.

(10) Patent No.: US 6,605,479 B1
(45) Date of Patent: Aug. 12, 2003

(54) METHOD OF USING DAMAGED AREAS OF A WAFER FOR PROCESS QUALIFICATIONS AND EXPERIMENTS, AND SYSTEM FOR ACCOMPLISHING SAME

(75) Inventors: Alexander J. Pasadyn, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/917,327

(22) Filed: Jul. 27, 2001

(51) Int. Cl.⁷ .............................................. H01L 21/66
(52) U.S. Cl. ............................ 438/14; 438/15; 438/17; 438/18; 438/51; 438/64
(58) Field of Search ............................. 438/14, 15, 17, 438/18, 51, 64

(56) References Cited

U.S. PATENT DOCUMENTS

| | | | | |
|---|---|---|---|---|
| 5,915,231 A | * | 6/1999 | Beffa ........................... | 438/14 |
| 6,208,947 B1 | * | 3/2001 | Beffa ........................... | 438/14 |
| 6,210,984 B1 | * | 4/2001 | Farnworth et al. ............. | 438/15 |
| 6,219,908 B1 | * | 4/2001 | Farnworth et al. ............. | 438/16 |
| 6,238,942 B1 | * | 5/2001 | Farnworth .................... | 438/15 |
| 6,258,609 B1 | * | 7/2001 | Farnworth et al. ............. | 438/14 |
| 6,363,329 B2 | * | 3/2002 | Beffa ........................... | 438/14 |
| 6,383,825 B1 | * | 5/2002 | Farnworth et al. ............. | 438/14 |
| 6,395,566 B2 | * | 5/2002 | Farnworth .................... | 438/15 |
| 6,492,187 B1 | * | 12/2002 | Farnworth et al. ............. | 438/15 |

* cited by examiner

Primary Examiner—John F. Niebling
Assistant Examiner—Lynne A. Gurley
(74) Attorney, Agent, or Firm—Williams, Morgan & Amerson, P.C.

(57) ABSTRACT

In one illustrative embodiment, the method comprises providing a wafer, forming a plurality of die above the wafer, identifying a plurality of good die and at least one non-useful die from the plurality of die, and performing a test process on the at least one non-useful die but not on the good die. In another aspect, the present invention is directed to a system that comprises a metrology tool for receiving a wafer having a plurality of die formed thereabove and identifying a plurality of good die and at least one non-useful die from the plurality of die formed above the wafer, and a process tool for performing a test process on the at least one non-useful die on the wafer but not on the plurality of good die.

27 Claims, 3 Drawing Sheets

METHOD OF USING DAMAGED AREAS OF A WAFER FOR PROCESS QUALIFICATIONS AND EXPERIMENTS, AND SYSTEM FOR ACCOMPLISHING SAME

BACKGROUND OF THE INVENTION

1. Field of the Invention

This invention relates generally to semiconductor fabrication technology, and, more particularly, to a method of using damaged areas of a wafer for process qualifications and experiments, and a system for accomplishing same.

2. Description of the Related Art

In the process of forming integrated circuit devices, millions of transistors, such as the illustrative transistor 10 depicted in FIG. 1, are formed above a semiconducting wafer. By way of background, an illustrative field effect transistor 10, as shown in FIG. 1, may be formed above a surface 15 of a semiconducting wafer 11 comprised of doped-silicon. The wafer 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the wafer 11. Shallow trench isolation regions 18 may be provided to isolate the transistor 10 electrically from neighboring semiconductor devices, such as other transistors (not shown).

In general, semiconductor manufacturing operations involve, among other things, the formation of layers of various materials, e.g., polysilicon, insulating materials, etc., and the selective removal of portions of those layers by performing known photolithographic and etching techniques. These processes, along with various ion implant and heating processes, are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the wafer. These conductive interconnections allow electrical signals to propagate between the transistors formed above the wafer.

As shown in FIG. 2, a plurality of die 26 are typically formed above the wafer 11. The die 26 define the area of the wafer 11 where production integrated circuit devices, e.g., microprocessors, ASICs, memory devices, will be formed. The size, shape and number of die 26 per wafer 11 depend upon the type of device under construction. For example, several hundred die 26 may be formed above an 8-inch diameter wafer 11. The wafer 11 may also have an alignment notch 17 that is used to provide relatively rough alignment of the wafer 11 prior to performing certain processes, e.g., an alignment process prior to performing an exposure process in a stepper tool.

During the course of manufacturing integrated circuit devices on the wafer 11, it is not uncommon for one or more problems to arise such that one or more die 26 are, for all practical purposes, rendered useless. That is, for a variety of reasons, it is determined that integrated circuit devices suitable for their intended use cannot be formed on such useless die. Such useless die are sometimes referred to as "bad" die, as opposed to "good" die where useful integrated circuit devices may be formed. The die 26 may become useless due to a variety of reasons, e.g., errors in patterning one or more layers, misalignment of layers, incomplete line formation, particle contamination, etc. Traditionally, even after the bad die are identified, they are subjected to the same subsequent process operations as are the good die on the wafer 11. Depending upon the number of bad die on the wafer 11, they may consume a great deal of very valuable plot space on the wafer 11.

Traditionally, test wafers are used to qualify various processes and/or to conduct experiments as to the acceptability of new processes or proposed process changes. These test wafers tend to be expensive, and consume valuable and scarce processing resources. Moreover, production die 26 are not produced on the test wafer, i.e., the test wafers are not used to produce final integrated circuit products. Accordingly, process yields may be reduced. Additionally, as the size of the wafers continues to increase, e.g., from 8-inch wafers to 12-inch wafers, the use of such test wafers becomes more expensive. What is desired is a method that makes use of otherwise wasted plot space occupied by the bad die on a wafer 11.

The present invention is directed to a method and system that may solve, or at least reduce, some or all of the aforementioned problems.

SUMMARY OF THE INVENTION

In general, the present invention is directed to a method of using damaged areas of a wafer for process qualifications and experiments, and a system for accomplishing same. In one illustrative embodiment, the method disclosed herein comprises providing a wafer, forming a plurality of die above the wafer, identifying a plurality of good die and at least one non-useful die from the plurality of die, and performing a test process on the at least one non-useful die on the wafer but not on the good die.

In another aspect, the present invention is directed to a system that comprises a metrology tool for receiving a wafer having a plurality of die formed thereabove and identifying a plurality of good die and at least one non-useful die on a wafer from the plurality of die formed above the wafer, and a process tool for performing a test process on the at least one non-useful die on the wafer but not on the plurality of good die. In some embodiments, a controller may be provided to assist in identifying the non-useful die or in performing that operation alone.

BRIEF DESCRIPTION OF THE DRAWINGS

The invention may be understood by reference to the following description taken in conjunction with the accompanying drawings, in which like reference numerals identify like elements, and in which.

Figure 1:
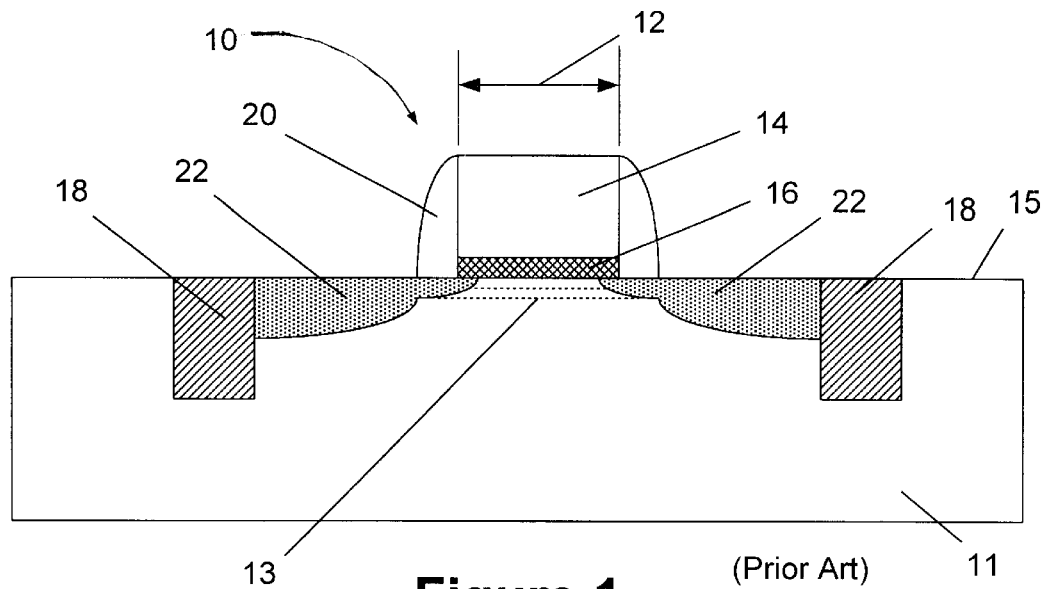
FIG. 1 is a cross-sectional view of an illustrative prior art transistor.
Figure 2:
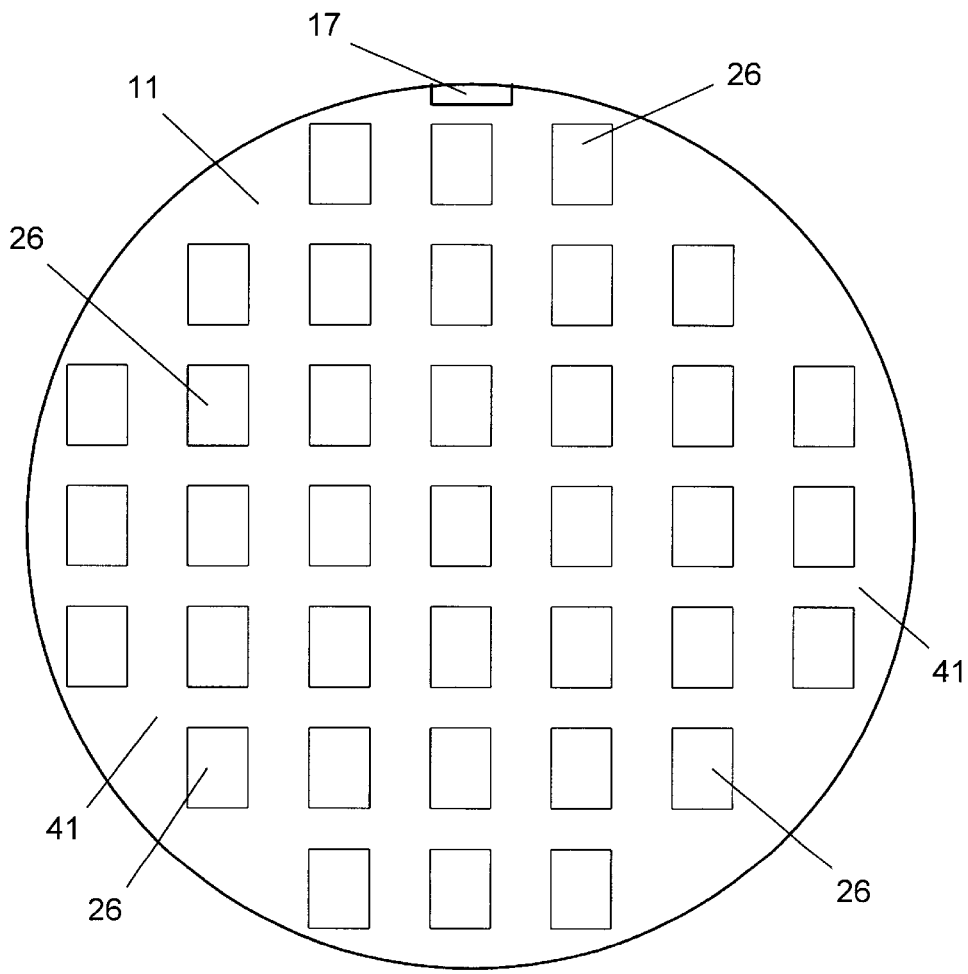
FIG. 2 is a plan view of an illustrative prior art wafer having a plurality of die formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Moreover, the components of the illustrative system do not depict all of the supporting structures and devices that are part of such real-word components. Nevertheless, the attached drawings are included to describe and explain illustrative examples of the present invention.

In general, the present invention is directed to a method of using damaged areas of wafer for process qualifications and experiments, and a system for accomplishing same. As will be readily apparent to those skilled in the art upon a complete reading of the present application, the present method is applicable to a variety of technologies, e.g. NMOS, PMOS, CMOS, etc., and it is readily applicable to a variety of devices, including, but not limited to, logic devices, memory devices, etc.

Figure 3:
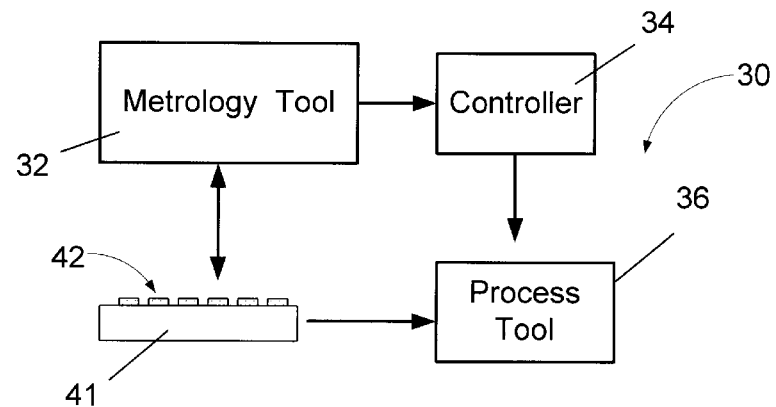
FIG. 3 depicts an illustrative embodiment of a system in accordance with one embodiment of the present invention.
Figure 4:
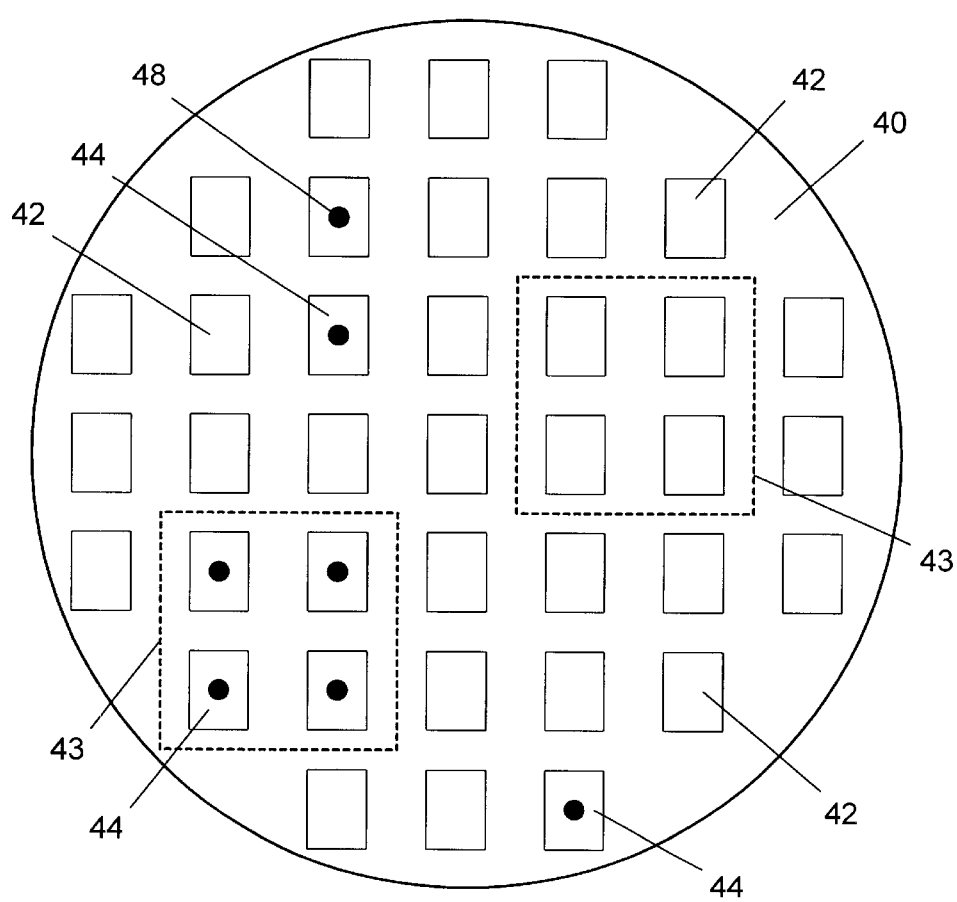
FIG. 4 is a plan view of a wafer having a plurality of bad die and good die formed thereabove.

The present invention will now be described with reference to FIGS. 3 and 4. FIG. 3 depicts an illustrative system 30 in accordance with one embodiment of the present invention. FIG. 4 depicts an illustrative wafer 40 having a plurality of good die 42 and a plurality of bad die 44 formed above the wafer 40. The bad die 44 are indicated with a dot 48. The term "bad die" should be understood to refer to the situation where it has been determined, by whatever means, and for whatever reasons, that the bad die 44 will likely not produce useful integrated circuit products. Of course, the number and location of the bad die 44 on the wafer 40 may vary. For example, for purposes of explanation, seven bad die 44 are illustratively depicted in FIG. 4.

The system 30 depicted in FIG. 3 is comprised of a metrology tool 32, a controller 34 and a process tool 36. The metrology tool 32 is intended to be representative of any type of metrology tool that may be useful in identifying the bad die 44 on the wafer 40. For example, the metrology tool 32 may be a scanning electron microscope useful for examining for particle defects and/or incomplete feature formation on a die. Alternatively, the metrology tool 32 may be an electrical testing device useful for detecting the resistance of one or more components fabricated on the die, or it may be used to determine if bridging is present on certain previously formed structures. For example, the metrology tool 32 may be an electrical testing device useful for determining whether any bridging is present on a plurality of previously formed gate electrode structures (not shown). Other metrology tools may also be used such as a profilometer, a pattern recognition tool, a defect inspection tool, a four-point probe, etc.

The process tool 36 is intended to be representative of any type of process tool commonly found in modern integrated manufacturing facilities. For example, the process tool 36 may be an ion implant tool, a stepper, etc. In general, in accordance with one embodiment of the present invention, the process tool 36 will be used to perform a process operation on one or more of the identified unusable or bad die 44. As described more fully below, the process operation performed on the bad die 44 is different than the process operations performed on the good die 42 of the wafer 40. For example, the process tool 36 may perform experimental processes or form experimental patterns or structures on the bad die 44, while the good die 42 are subjected to the normal processing operations originally intended for the wafer 40.

In the illustrated embodiments, the controller 34 is a computer programmed with software to implement the functions described herein. Moreover, the functions described for the controller 34 may be performed by one or more controllers spread through the system. For example, the controller 34 may be a fab level controller that is used to control processing operations throughout all or a portion of a semiconductor manufacturing facility. Alternatively, the controller 34 may be a lower level computer that controls only portions or cells of the manufacturing facility. Moreover, the controller 34 may be a stand-alone device, or it may reside on the process tool 36 or on the metrology tool 32. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 34, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is directed to several inventive methods. For example, the present invention may be employed in the context of testing or qualifying various stepper exposure processes. In general, photolithography is a process typically employed in semiconductor manufacturing. Photolithography generally involves forming a patterned layer of photoresist above one or more layers of material that are desired to be patterned, and using the patterned photoresist layer as a mask in subsequent etching processes. In general, in photolithography operations, the pattern desired to be formed in the underlying layer or layers of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

A typical stepper tool (not shown) contains a light source (not shown) that is used to project light through a reticle (not shown) onto a layer of photoresist. Ultimately, the image in the reticle will be transferred to the layer of photoresist, and the underlying process layer will be patterned using the patterned layer of photoresist as a mask during one or more subsequent etching processes. The exposure process performed on the wafer 40 is typically performed on a flash-by-flash basis as the wafer 40 is moved, or stepped, relative to the light source in the stepper tool. During each step, the light source projects light onto a given area of the wafer 40, i.e., each flash is projected onto an exposure field 43. The size of the exposure field 43, as well as the number of die within each exposure field 43, may vary greatly. For example, an illustrative exposure field 43 is depicted in FIG. 4 wherein four of the die fall within the exposure field 43, i.e., a so-called 2×2 pattern. However, the number of die and size of the exposure field 43 may vary. For example, integrated circuits may be exposed using a 1×2 pattern (covering 2 die), a 5×5 pattern (covering 25 die), a single die pattern, etc. The precise pattern of the exposure field 43 may be based upon the product under construction as well as the desires and judgment of the appropriate process engineer.

As stated previously, it is very important that the various features of a transistor, e.g., a gate electrode structure, be formed very precisely. Accordingly, there is a constant desire to improve or experiment with various processes that may enhance the ability to form such features accurately. The stepper exposure process is one area where great effort is focused in trying to develop improved processes. For example, the stepper exposure dose and/or focal plane of a stepper exposure process may be varied in an attempt to produce optimal photoresist features in a layer of photoresist. Such exposure processes are important because the photoresist features formed in a layer of photoresist have an impact on the ability to accurately form the desired features.

According to one embodiment of the present invention, once the bad die 44 are identified, the process tool 36 may be used to perform various experimental or test stepper exposure processes in the area occupied by the bad die 44. That is, the good die 42 will continue to be processed in accordance with the standard process flow for the product being manufactured. In contrast, at least some of the identified bad die 44 will be subjected to the test or experimental exposure process. Depending upon the number and location of the bad die 44 and the size of the exposure field 43, one or more test processes may be performed on a single wafer 40. Thereafter, the bad die 44 on which the test or experimental exposure process is performed may be analyzed to evaluate the effectiveness and desirability of the test or experimental process. Thus, through use of the present invention, various experimental processes may be performed in the area occupied by the bad die 44, thereby avoiding the use of expensive test wafers and avoiding excessive consumption of valuable and scarce production resources. That is, production resources are not dedicated solely to the duty of performing test or experimental processes on test wafers.

The present invention may also be employed with other processes. For example, the present invention may be used to perform test or experimental ion implant procedures on the bad die 44. For example, various parameters of an ion implant process, such as energy level, implant angle, dopant dosage, etc., may be varied, and the test ion implant process(es) may be performed on the bad die 44. This embodiment of the invention may require one or more additional masking steps, i.e., one to cover the bad die 44 during the normal ion implant step performed on all of the good die 42, and a second masking step that covers the good die 42 so that the experimental or test ion implant process may be performed on only the bad die 44. Thus, through use of the present invention, various experimental ion implant process(es) may be performed on the bad die 44 in an effort to optimize the implant regions formed by the process. For example, the experimental ion implant process(es) may be performed on the bad die 44 to optimize at least one of a junction depth and concentration profile of such implant regions. Etching is another process that may be tested in the areas defined by the bad die 44. However, etching, like ion implant, may require one or more additional masking operations to selectively expose the bad die 44 to the experimental or test etching procedures being performed.

As stated previously, the present invention may also be employed in situations where different structures are formed on the bad die 44 as compared to the structures formed on the good die 42. For example, various test structures and/or experimental semiconductor devices may be formed on the bad die 44. As used herein, the term test structure shall be understood to encompass structures that are different than the structures being formed on the good die 42, e.g., test structures, experimental devices, etc. Such test structures may include, for example, scatterometry gratings, electrical test structures which may be destructive or non-destructive, isolated linewidth target structures, and dense linewidth target structures.

Figure 5:
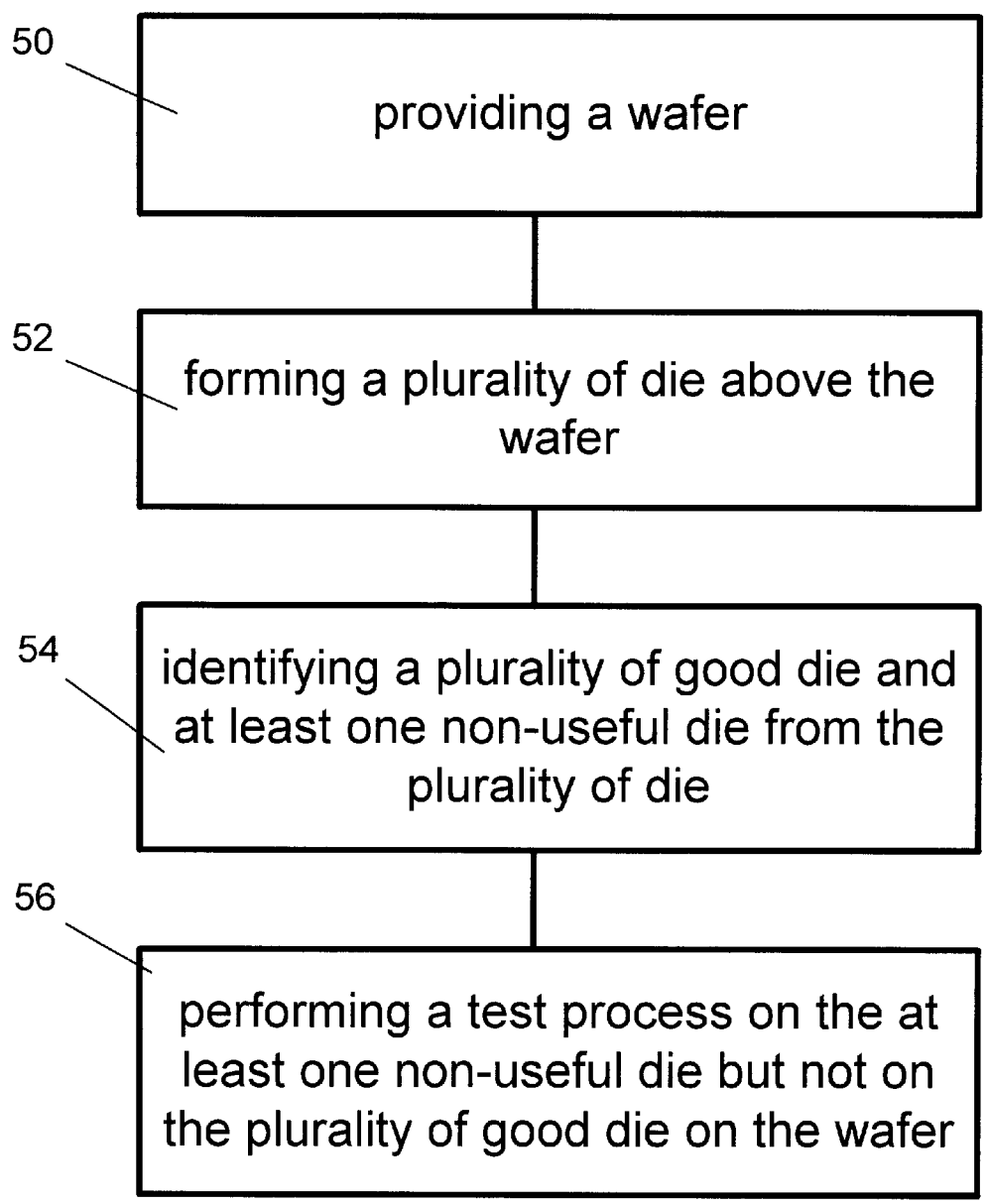
FIG. 5 is an illustrative embodiment of the present invention depicted in flowchart form.

One illustrative embodiment of a method in accordance with the present invention is depicted in flowchart form in FIG. 5. As shown therein, the method comprises providing a wafer, as set forth at block 50, and forming a plurality of die above the wafer 40, as indicated at block 52. The method further comprises identifying a plurality of good die 42 and at least one non-useful die 44 from the plurality of die, as recited at block 54, and performing a test process on the at least one non-useful die 44 on the wafer but not on the good die 42, as described at block 56. As used herein, the term test process should be understood to refer to a process that is being evaluated or considered for use in manufacturing operations. It will typically be different, in at least some respects, from the standard process operation performed on the wafers in general.

In another illustrative embodiment, the method comprises providing a wafer, forming a plurality of die above the wafer, identifying a plurality of good die and at least one non-useful die from the plurality of die, and forming at least one test structure on at least one non-useful die but not on the plurality of good die.

In another aspect, the present invention is directed to a system 30 that comprises a metrology tool 32 for receiving a wafer 40 having a plurality of die formed thereabove and identifying a plurality of good die 42 and at least one non-useful die 44 on a wafer 40 from a plurality of die formed above the wafer 40, and a process tool 36 for performing a test process on the non-useful die 44 on the wafer 40, but not on the plurality of good die 42 on the wafer 40. In some embodiments, a controller 34 may be used with the metrology tool 32 to identify the good and bad die, or the controller 36 may make such identifications by itself based upon data obtained by the metrology tool.

In another illustrative embodiment, the present invention is directed to a system comprised of a testing means for receiving a wafer 40 having a plurality of die formed thereabove and identifying a plurality of good die 42 and at least one bad die 44 from the plurality of die formed above the wafer 40, and a means for performing a process on the bad die 44, but not on the plurality of good die 42 formed on the wafer 40. In the disclosed embodiment, the testing means is the metrology tool 32 and/or the controller 34. In the disclosed embodiment, the means for performing the test process on the bad die 44 is the process tool 36. Depending upon the particular application, the process tool 36 may be, for example, a stepper tool, an ion implant tool, an etch tool, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

providing a wafer;

forming a plurality of die above said wafer;

identifying a plurality of good die and at least one non-useful die from said plurality of die; and performing a test manufacturing process on said at least one non-useful die after said at least one non-useful die is identified but not on said plurality of good die.

2. The method of claim 1, wherein providing a wafer comprises providing a wafer comprised of silicon.

3. The method of claim 1, wherein providing a wafer comprises providing a wafer having a diameter of approximately eight inches.

4. The method of claim 1, wherein providing a wafer comprises providing a wafer having a diameter of approximately twelve inches.

5. The method of claim 1, wherein identifying a plurality of good die and at least one non-useful die from said plurality of die comprises identifying a plurality of good die and at least one non-useful die from said plurality of die through use of a metrology tool comprised of at least one of a scanning electron microscope, a resistance meter, a profilometer, and a four-point probe.

6. The method of claim 1, wherein performing a test manufacturing process on said at least one non-useful die but not on said plurality of good die on said wafer comprises performing a test manufacturing process comprised of at least one of a stepper exposure process, an ion implant process, and an etching process on said at least one non-useful die on said wafer.

7. A method, comprising:

providing a wafer;

forming a plurality of die above said wafer;

identifying a plurality of good die and at least one non-useful die from said plurality of die; and performing a test manufacturing process on said at least one non-useful die after said at least one non-useful die is identified but not on said plurality of good die, said test manufacturing process comprised of at least one of a stepper exposure process, an ion implant process and an etching process.

8. The method of claim 7, wherein providing a wafer comprises providing a wafer comprised of silicon.

9. The method of claim 7, wherein providing a wafer comprises providing a wafer having a diameter of approximately eight inches.

10. The method of claim 7, wherein providing a wafer comprises providing a wafer having a diameter of approximately twelve inches.

11. The method of claim 7, wherein identifying a plurality of good die and at least one non-useful die from said plurality of die comprises identifying a plurality of good die and at least one non-useful die from said plurality of die through use of a metrology tool comprised of at least one of a scanning electron microscope, a resistance meter, a profilometer, and a four-point probe.

12. A method, comprising:

providing a wafer comprised of silicon;

forming a plurality of die above said wafer;

identifying a plurality of good die and a plurality of non-useful die from said plurality of die; and performing a test manufacturing process on said plurality of non-useful die after said at least one non-useful die is identified but not on said plurality of good die, said test manufacturing process comprised of at least one of a stepper exposure process, an ion implant process and an etching process.

13. The method of claim 12, wherein providing a wafer comprises providing a wafer having a diameter of approximately eight inches.

14. The method of claim 12, wherein providing a wafer comprises providing a wafer having a diameter of approximately twelve inches.

15. The method of claim 12, wherein identifying a plurality of good die and a plurality of non-useful die from said plurality of die comprises identifying a plurality of good die and a plurality of non-useful die from said plurality of die through use of a metrology tool comprised of at least one of a scanning electron microscope, a resistance meter, a profilometer, and a four-point probe.

16. A method, comprising:

providing a wafer;

forming a plurality of die above said wafer;

identifying a plurality of good die and at least one non-useful die from said plurality of die; and forming at least one test structure on said at least one non-useful die after said at least one non-useful die is identified but not on said plurality of good die.

17. The method of claim 16, wherein providing a wafer comprises providing a wafer comprised of silicon.

18. The method of claim 16, wherein providing a wafer comprises providing a wafer having a diameter of approximately eight inches.

19. The method of claim 16, wherein providing a wafer comprises providing a wafer having a diameter of approximately twelve inches.

20. The method of claim 16, wherein identifying a plurality of good die and at least one non-useful die from said plurality of die comprises identifying a plurality of good die and at least one non-useful die from said plurality of die through use of a metrology tool comprised of at least one of a scanning electron microscope, a resistance meter, a profilometer, and a four-point probe.

21. The method of claim 16, wherein forming at least one test structure on said at least one non-useful die after said at least one non-useful die is identified but not on said plurality of good die on said wafer comprises forming at least one test structure comprised of at least one of a scatterometry grating structure, an isolated linewidth target structure, and a dense linewidth target structure on said at least one non-useful die on said wafer.

22. A method, comprising:

providing a wafer;

forming a plurality of die above said wafer;

identifying a plurality of good die and a plurality of non-useful die from said plurality of die; and forming at least one test structure on said plurality of non-useful die after said plurality of non-useful die are identified but not on said plurality of good die.

23. The method of claim 22, wherein providing a wafer comprises providing a wafer comprised of silicon.

24. The method of claim 22, wherein providing a wafer comprises providing a wafer having a diameter of approximately eight inches.

25. The method of claim 22, wherein providing a wafer comprises providing a wafer having a diameter of approximately twelve inches.

26. The method of claim 22, wherein identifying a plurality of good die and at least one non-useful die from said plurality of die comprises identifying a plurality of good die and at least one non-useful die from said plurality of die through use of a metrology tool comprised of at least one of a scanning electron microscope, a resistance meter, a profilometer, and a four-point probe.

27. The method of claim 22, wherein forming at least one test structure comprises forming at least one of a scatterometry grating structure, an isolated linewidth target structure, and a dense linewidth target structure.

* * * * *